(12) United States Patent
Matsukura et al.

(10) Patent No.: US 11,322,654 B2
(45) Date of Patent: May 3, 2022

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Tetsuhiko Inazu, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 16/993,836

(22) Filed: Aug. 14, 2020

(65) Prior Publication Data

US 2021/0057608 A1   Feb. 25, 2021

(30) Foreign Application Priority Data

Aug. 20, 2019 (JP) ............... JP2019-150627

(51) Int. Cl.
*H01L 33/32* (2010.01)
*H01S 5/343* (2006.01)
*H01L 33/14* (2010.01)

(52) U.S. Cl.
CPC .............. *H01L 33/32* (2013.01); *H01L 33/14* (2013.01); *H01S 5/343* (2013.01)

(58) Field of Classification Search
None
See application file for complete search history.

(56) References Cited

U.S. PATENT DOCUMENTS

| | | | |
|---|---|---|---|
| 9,269,868 B2 | 2/2016 | Kushibe et al. | |
| 10,147,842 B2 | 12/2018 | Fujita et al. | |
| 10,283,671 B2 | 5/2019 | Fujita et al. | |
| 10,505,074 B2 | 12/2019 | Asada et al. | |
| 10,686,098 B2 | 6/2020 | Asada et al. | |
| 2015/0060908 A1 | 3/2015 | Jain et al. | |
| 2015/0084069 A1 | 3/2015 | Kushibe et al. | |

(Continued)

FOREIGN PATENT DOCUMENTS

| | | |
|---|---|---|
| JP | 2015-065245 A | 4/2015 |
| JP | 6001756 B2 | 10/2016 |

(Continued)

OTHER PUBLICATIONS

Japanese Office Action dated Dec. 25, 2019 issued in JP 2019-150627.

(Continued)

*Primary Examiner* — Bradley Smith
(74) *Attorney, Agent, or Firm* — Scully, Scott, Murphy & Presser, PC

(57) ABSTRACT

A nitride semiconductor light-emitting element includes an active layer that emits ultraviolet light, a p-type AlGaN-based electron blocking stack body that is located on the active layer and has a structure formed by sequentially stacking a first electron blocking layer, a second electron blocking layer and a third electron blocking layer from the active layer side, and a p-type contact layer located on the electron blocking stack body. An Al composition ratio in the second electron blocking layer is lower than an Al composition ratio in the first electron blocking layer, and an Al composition ratio in the third electron blocking layer decreases from the second electron blocking layer side toward the p-type contact layer side.

7 Claims, 9 Drawing Sheets

(56) References Cited

U.S. PATENT DOCUMENTS

| | | |
|---|---|---|
| 2018/0166604 A1 | 6/2018 | Fujita et al. |
| 2018/0287014 A1* | 10/2018 | Asada ................... H01L 33/145 |
| 2019/0081203 A1 | 3/2019 | Fujita et al. |
| 2019/0148592 A1 | 5/2019 | Takeuchi et al. |
| 2019/0371968 A1 | 12/2019 | Asada et al. |

FOREIGN PATENT DOCUMENTS

| | | |
|---|---|---|
| JP | 2019-087712 A | 6/2019 |
| WO | WO 2017/057149 A1 | 4/2017 |
| WO | WO 2018/052252 A1 | 3/2018 |

OTHER PUBLICATIONS

Taiwanese Official Action dated Dec. 9, 2021 from related TW 109127850 together with an English language translation.

* cited by examiner

NITRIDE SEMICONDUCTOR LIGHT-EMITTING ELEMENT

CROSS-REFERENCE TO RELATED APPLICATION

The present application is based on Japanese Patent Application No. 2019-150627 filed on Aug. 20, 2019, the entire contents of which are incorporated herein by reference.

BACKGROUND OF THE INVENTION

1. Field of the Invention

The invention relates to a nitride semiconductor light-emitting element.

2. Related Art

In recent years, nitride semiconductor light-emitting elements, such as light-emitting diodes or laser diodes, which emit ultraviolet light have been put into practical use, and nitride semiconductor light-emitting elements having longer emission lifetime have been under development (see, e.g., Japanese Patent No. 6001756).

The group III nitride semiconductor light-emitting element described in Japanese Patent No. 6001756 has a stacked structure having an n-type semiconductor layer, a light-emitting layer with a quantum well structure having a well layer(s) and a barrier layer(s) which contain at least Al, an electron blocking layer having a higher Al composition ratio than the barrier layer, a p-type cladding layer formed on the electron blocking layer, and a p-type contact layer formed on the p-type cladding layer. Japanese Patent No. 6001756 describes that this configuration improves life of the element.

Patent Document 1: Japanese Patent No. 6001756

In the structure in which the electron blocking layer is provided between the light-emitting layer and the p-type cladding layer, however, the electron blocking layer is formed to have a relatively high Al composition ratio so that efficiency of electron injection into the light-emitting layer is increased. Therefore, the difference in Al composition ratio between the electron blocking layer and the p-type contact layer is large and quality deterioration due to lattice mismatch may cause a decrease in emission lifetime. That is, in case of the structure described above, it is difficult to efficiently achieve both improvement in luminous efficiency of the light-emitting element, which is achieved by increasing efficiency of electron injection, and improvement in emission lifetime of the light-emitting element.

THE SUMMARY OF THE INVENTION

Therefore, it is an object of the invention to provide a nitride semiconductor light-emitting element of which emission life can be extended while improving luminous efficiency.

According to one aspect of the present invention, a nitride semiconductor light-emitting element, comprises:

an active layer that emits ultraviolet light;

a p-type AlGaN-based electron blocking stack body that is located on the active layer and comprises a structure formed by sequentially stacking a first electron blocking layer, a second electron blocking layer and a third electron blocking layer from the active layer side; and a p-type contact layer located on the electron blocking stack body, wherein an Al composition ratio in the second electron blocking layer is lower than an Al composition ratio in the first electron blocking layer, and an Al composition ratio in the third electron blocking layer decreases from the second electron blocking layer side toward the p-type contact layer side.

Points of the Invention

According to the present invention, it is possible to provide a nitride semiconductor light-emitting element of which emission life can be extended while improving luminous efficiency.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiments of the invention will be described in reference to the drawings. The embodiments below are described as preferred examples for implementing the invention. Although some part of the embodiments specifically illustrates various technically preferable matters, the technical scope of the invention is not limited to such specific aspects.

First Embodiment

Configuration of Nitride Semiconductor Light-Emitting Element

Figure 1:
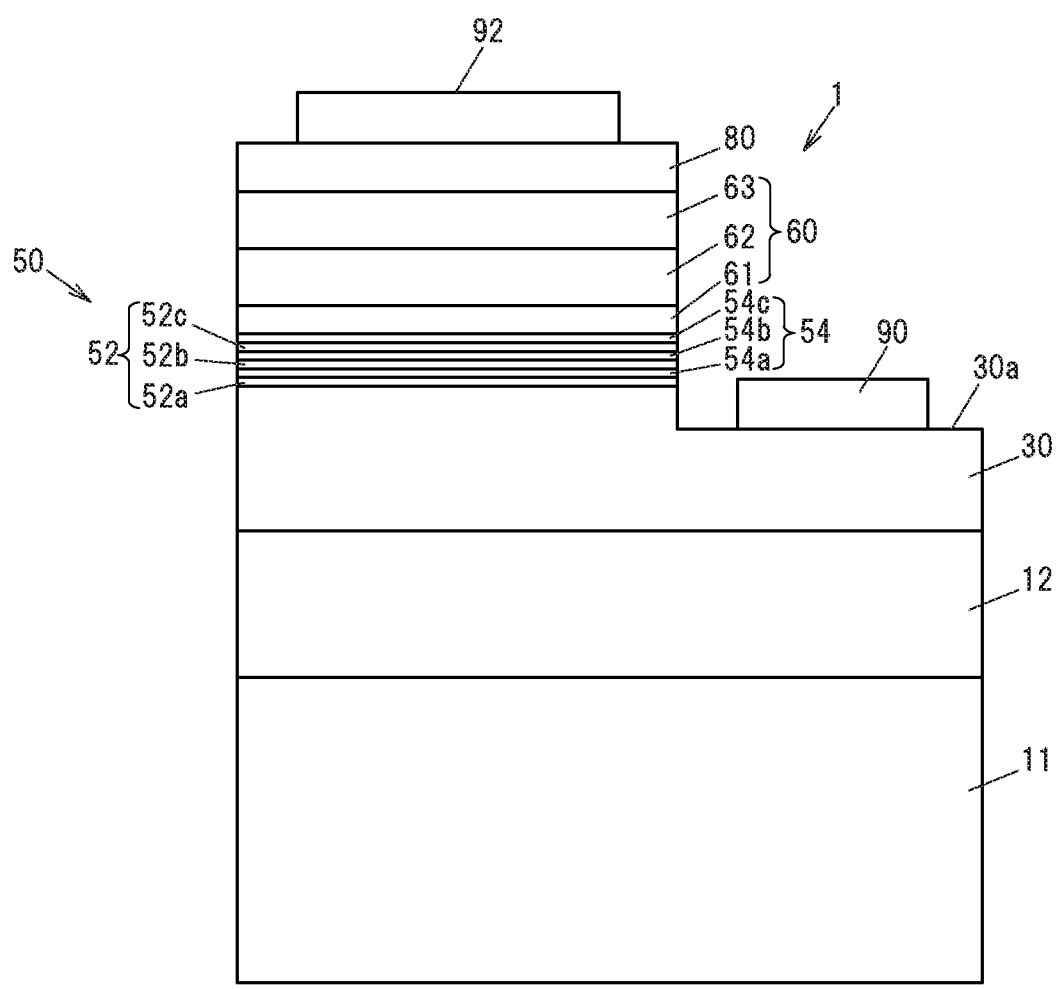
FIG. 1 is a schematic cross-sectional view showing an exemplary configuration of a nitride semiconductor light-emitting element in the first embodiment of the present invention.

FIG. 1 is a schematic cross-sectional view showing an exemplary configuration of a nitride semiconductor light-emitting element in the first embodiment of the invention. A scale ratio of each constituent element in FIG. 1 is not necessarily the same as the actual scale ratio of the nitride semiconductor light-emitting element. A nitride semiconductor light-emitting element 1 (hereinafter, also simply referred to as "light-emitting element 1") includes, e.g., laser diode or light-emitting diode (LED). In the first embodiment, a light-emitting diode (LED) which emits ultraviolet light at a central wavelength of 250 nm to 360 nm will be described as an example of the light-emitting element 1.

As shown in FIG. 1, the light-emitting element 1 includes a substrate 11, a buffer layer 12, an n-type cladding layer 30, an active layer 50, an electron blocking stack body 60 formed by stacking plural electron blocking layers, a p-type contact layer 80, an n-side electrode 90 and a p-side electrode 92.

The semiconductor which can be used to form the light-emitting element 1 is, e.g., a binary, ternary, or quaternary group III nitride semiconductor which is expressed by $Al_rGa_sIn_{1-r-s}N$ ($0 \leq r \leq 1$, $0 \leq s \leq 1$, $0 \leq r+s \leq 1$). In addition, the group III elements thereof may be partially substituted with boron (B) or thallium (Tl), etc., and N may be partially substituted with phosphorus (P), arsenic (As), antimony (Sb) or bismuth (Bi), etc. Each constituent element will be described below.

The active layer 50 includes three barrier layers 52a, 52b, 52c, and three well layers 54a, 54b, 54c. The barrier layer 52a is located on the n-type cladding layer 30 side, and the well layer 54c is located on the electron blocking stack body 60 side. The electron blocking stack body 60 includes a structure in which a first electron blocking layer 61, a second electron blocking layer 62 and a third electron blocking layer 63 are stacked sequentially. Hereinafter, "the barrier layer 52" is used as a collective term for the three barrier layers 52a, 52b, 52c and "the well layer 54" is used as a collective term for the three well layer 54a, 54b, 54c.

Substrate 11

The substrate 11 is a substrate transparent to ultraviolet light emitted from the light-emitting element 1. For example, a sapphire substrate formed of sapphire ($Al_2O_3$) is used as the substrate 11. Alternatively, the substrate 11 may be an AlN single crystal substrate formed of aluminum nitride (AlN).

Buffer Layer 12

The buffer layer 12 is formed on the substrate 11. The buffer layer 12 is an AlN layer formed of AlN. The buffer layer 12 has a thickness of about 1.0 μm to 4.5 μm. The buffer layer 12 may have a single layer or a multilayer structure. When the substrate 11 is an AlN single crystal substrate, the buffer layer 12 may not necessarily be provided. An undoped AlGaN layer formed of AlGaN may be provided on the buffer layer 12.

n-Type Cladding Layer 30

The n-type cladding layer 30 is formed on the buffer layer 12. The n-type cladding layer 30 is a layer formed of n-type AlGaN and is, e.g., an AlGaN layer doped with silicon (Si) as an n-type impurity. Alternatively, germanium (Ge), selenium (Se) or tellurium (Te), etc., may be used as the n-type impurity. The n-type cladding layer 30 has a thickness of about 1 μm to 4 μm and is, e.g., about 2 μm to 3 μm in thickness. The n-type cladding layer 30 may have a single layer or a multilayer structure.

Active Layer 50

The active layer 50 is formed on the n-type cladding layer 30. In the present embodiment, the active layer 50 has a quantum well structure in which the three barrier layers 52a, 52b, 52c, including the barrier layer 52a located on the n-type cladding layer 30 side, and the three well layers 54a, 54b, 54c, including the well layer 54c located on the electron blocking stack body 60 side, are stacked alternately.

The barrier layer 52 has a thickness in a range of, e.g., about 3 nm to 50 nm. The well layer 54 has a thickness in a range of, e.g., about 1 nm to 5 nm. The numbers of the barrier layers 52 and the well layers 54 are not limited to three, and may be respectively one, or two, or four or more. The configuration with one each of the barrier layer 52 and the well layer 54 is also called a single quantum well (SQW) structure, and the configuration with plural barrier layers 52 and well layers 54 is also called a multi-quantum well (MQW) structure.

The barrier layer 52 and the well layer 54 include AlGaN. An Al composition ratio (also called "AlN mole fraction") in AlGaN constituting the barrier layer 52 is higher than an Al composition ratio in AlGaN constituting the well layer 54.

In addition, each of the Al composition ratio in AlGaN constituting the barrier layer 52 (hereinafter, also referred to as "the Al composition ratio in the barrier layer 52") and the Al composition ratio in AlGaN constituting the well layer 54 (hereinafter, also referred to as "the Al composition ratio in the well layer 54") is appropriately adjusted so that a band gap in the active layer 50 is not less than 3.4 eV and the active layer 50 can output ultraviolet light at a wavelength of not more than 360 nm. As an example, to obtain the emission wavelength of 250 nm to 280 nm, the Al composition ratio in the well layer 54 may be adjusted to $(40 \pm 10)\%$ and the Al composition ratio in the barrier layer 52 adjusted to $(80 \pm 10)\%$ (see FIGS. 3, 4, 5 and 6).

Electron Blocking Stack Body 60

The electron blocking stack body 60 is formed on the active layer 50. The electron blocking stack body 60 is a layer serving to prevent the outflow of electrons toward the p-type contact layer 80 side. The electron blocking stack body 60 is an AlGaN-based layer having a sequentially stacked structure composed of the first electron blocking layer 61 located on the active layer 50 side, the second electron blocking layer 62 located on the first electron blocking layer 61, and the third electron blocking layer 63 located on the second electron blocking layer 62.

The first electron blocking layer 61 acts as an energy barrier layer to be a barrier by which electrons supplied from the n-type cladding layer 30 into the active layer 50 are prevented from flowing out. The third electron blocking layer 63 acts as a buffer layer which smoothly connects between the p-type contact layer 80 and the electron blocking stack body 60 in terms of the Al composition ratio and thereby reduces lattice mismatch. The second electron blocking layer 62 acts as an intermediate layer which is interposed between the first electron blocking layer 61 and the third electron blocking layer 63 and contributes to reduction in thickness of the first electron blocking layer 61 and the resulting suppression of an increase in electrical resistance. However, the second electron blocking layer may not necessarily be provided.

The first electron blocking layer 61 is, e.g, an AlN layer formed of AlN. Both the second electron blocking layer 62 and the third electron blocking layer 63 are layers formed of p-type AlGaN and are, e.g., AlGaN layers doped with magnesium (Mg) as a p-type impurity. Alternatively, zinc (Zn), beryllium (Be), calcium (Ca), strontium (Sr), barium (Ba) or carbon (C) etc., may be used as the p-type impurity. The first electron blocking layer 61 may not necessarily be the AlN layer and may be a layer formed of p-type AlGaN which is doped with a p-type impurity, in the same manner as the second electron blocking layer 62 and the third electron blocking layer 63.

The thickness of the second electron blocking layer 62 is not less than the thickness of the first electron blocking layer 61. Preferably, the second electron blocking layer 62 is thicker than the first electron blocking layer 61. The second electron blocking layer 62 has a thickness that is, e.g., not less than 1 time and not more than 20 times the thickness of the first electron blocking layer 61. The thickness of the third electron blocking layer 63 is more than the thickness of the first electron blocking layer 61. Then, the thickness of the electron blocking stack body 60, i.e., the total thickness of the first electron blocking layer 61, the second electron blocking layer 62 and the third electron blocking layer 63 is not less than 10 nm and not more than 250 nm.

Figure 2:
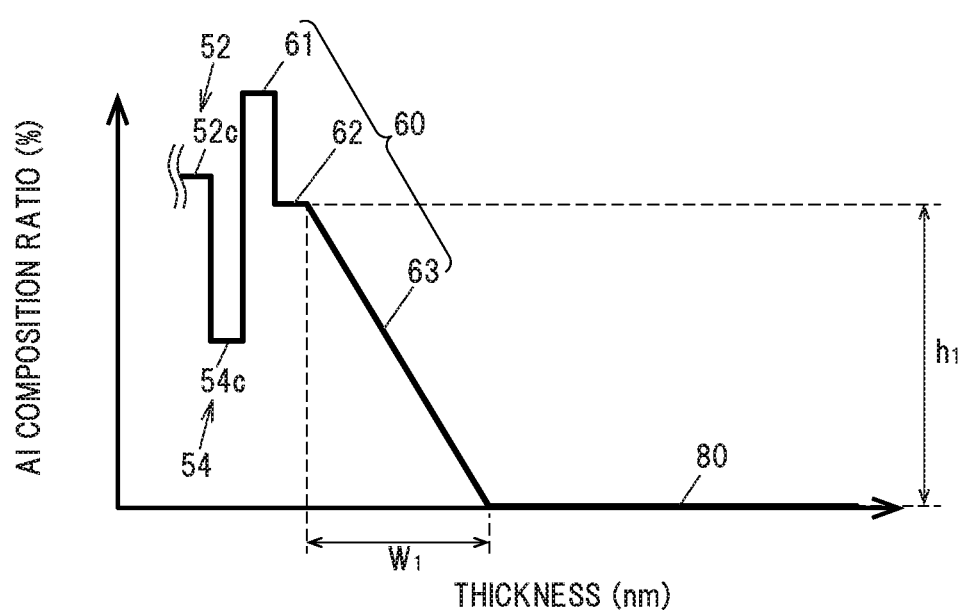
FIG. 2 is a schematic diagram illustrating an example of an Al composition ratio in an electron blocking stack body shown in FIG. 1.

Next, the Al composition ratio in p-type AlGaN constituting the electron blocking stack body 60 (hereinafter, also referred to as the "Al composition ratio in the electron blocking stack body 60", the same applies hereinafter) will be described in reference to FIG. 2. FIG. 2 is a schematic diagram illustrating an example of the Al composition ratio in the electron blocking stack body 60.

As shown in FIG. 2, the Al composition ratio in the first electron blocking layer 61 is higher than the Al composition ratios in the second electron blocking layer 62 and the third electron blocking layer 63. The Al composition ratio in the first electron blocking layer 61 is preferably not less than 90%, more preferably about 100% (i.e., the first electron blocking layer 61 is an AlN layer). This is to increase the functionality as an energy barrier by increasing the Al composition ratio.

The Al composition ratio in the second electron blocking layer 62 is not more than the Al composition ratio in the barrier layer 52. When the Al composition ratio in the second electron blocking layer 62 is increased, it is possible to enhance the effect of suppressing overflow of electrons, but efficiency of hole injection into the well layer 54 decreases. On the other hand, when the Al composition ratio is reduced, it is possible to improve the efficiency of hole injection into the well layer 54, but the effect of suppressing overflow of electrons is reduced and light absorption occurs depending on the emission wavelength. Considering such circumstances, the Al composition ratio in the second electron blocking layer 62 is preferably 60% to 80%.

The third electron blocking layer 63 is a composition gradient layer of which Al composition ratio has a gradient in the thickness direction. In detail, the Al composition ratio in the third electron blocking layer 63 continuously decreases from the second electron blocking layer 62 side toward the p-type contact layer 80 side. In addition, the Al composition ratio in the third electron blocking layer 63 on the second electron blocking layer 62 side (i.e., the maximum value of the Al composition ratio in the third electron blocking layer 63) is not more than the Al composition ratio in the barrier layer 52 (e.g., not more than 80%) and is more than the Al composition ratio in the p-type contact layer 80. However, decrease of the Al composition ratio in the third electron blocking layer 63 is not limited to a continuous decrease and may be, e.g., an intermittent decrease such as a stepwise decrease.

In short, the Al composition ratios in the active layer 50, the electron blocking stack body 60 and the p-type contact layer 80 satisfy the following expression (1):

First electron blocking layer 61>Barrier layer 52>Second electron blocking layer 62>Third electron blocking layer 63>p-type contact layer 80     (1).

The relation of the above expression (1) may be satisfied when the value used for the third electron blocking layer 63 having a gradient Al composition ratio is, e.g., a value obtained, as an intermediate value, by adding the maximum value (i.e., the Al composition ratio on the second electron blocking layer 62 side) and the minimum value (i.e., the Al composition ratio on the p-type contact layer 80 side) and dividing by two (i.e., an intermediate value). Alternatively, the above expression (1) may be satisfied when the value used for the third electron blocking layer 63 is, e.g., a value obtained by dividing the sum of all Al composition ratio values, from the highest value to the lowest value, in the third electron blocking layer 63 by the thickness of the third electron blocking layer 63 (i.e., an average value), instead of using the intermediate value. Hereinafter, the same explanation may be omitted.

A gradient percentage (i.e., a decrease rate) of the Al composition ratio in the third electron blocking layer 63 may be substantially constant in the thickness direction thereof, or may change in the thickness direction. When the decrease rate is constant, the Al composition ratio in the third electron blocking layer 63 decreases linearly. In this case, a decrease rate $d_1$ of the Al composition ratio in the third electron blocking layer 63 is expressed by the following equation (2):

$$d_1 = h_1/w_1 \qquad (2),$$

where $w_1$ is the thickness of the third electron blocking layer 63 and $h_1$ is a range of the Al composition ratio in the third electron blocking layer 63, i.e., a difference between the Al composition ratio on the second electron blocking layer 62 side and the Al composition ratio on the p-type contact layer 80 side.

The decrease rate $d_1$ of the Al composition ratio in the third electron blocking layer 63 is, e.g., more than 2.5%/nm and not more than 20%/nm. In other words, the decrease rate $d_1$ of the Al composition ratio in the third electron blocking layer 63 satisfies the following expression (3):

$$0.025/nm < d_1 \leq 0.20/nm \qquad (3).$$

p-Type Contact Layer 80

The p-type contact layer 80 is formed on the electron blocking stack body 60, in particular, on the third electron blocking layer 63. The p-type contact layer 80 is a p-type GaN layer which is, e.g., doped with a high concentration of impurity such as Mg. The p-type contact layer 80 may be a layer formed of, e.g., p-type AlGaN having an Al composition ratio of not more than 10%.

n-side electrode 90

The n-side electrode 90 is formed on a certain region of the n-type cladding layer 30. The n-side electrode 90 is formed of, e.g., a multilayered film formed by sequentially stacking titanium (Ti), aluminum (Al), Ti, and gold (Au) in this order (Ti/Al/Ti/Au) on the n-type cladding layer 30.

p-Side Electrode 92

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Method for Manufacturing Light-Emitting Element 1

Next, a method for manufacturing the light-emitting element 1 will be described. Firstly, the buffer layer 12 is grown on the substrate 11 at high temperature. Next, the n-type cladding layer 30, the active layer 50, the electron blocking stack body 60 and the p-type contact layer 80 are sequentially stacked on the buffer layer 12, thereby forming a circular plate-shaped nitride semiconductor stacked body (also called "wafer") with a predetermined diameter (e.g., about 50 mm).

The n-type cladding layer 30, the active layer 50, the electron blocking stack body 60 and the p-type contact layer 80 may be formed by a well-known epitaxial growth method such as Metal Organic Chemical Vapor Deposition (MOCVD) method, Molecular Beam Epitaxy (MBE) method, or Hydride Vapor Phase Epitaxy (HVPE) method.

Next, a mask is formed on the p-type contact layer 80. Then, the active layer 50, the electron blocking stack body 60 and the p-type contact layer 80 are removed in the exposed region in which the mask is not formed. The active layer 50, the electron blocking stack body 60 and the p-type contact layer 80 may be removed by, e.g., plasma etching.

The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 may be formed by, e.g., a well-known method such as electron beam evaporation method or sputtering method. The light-emitting element 1 shown in FIG. 1 is obtained by cutting this wafer into pieces with a predetermined dimension.

EXAMPLES

Figure 3:
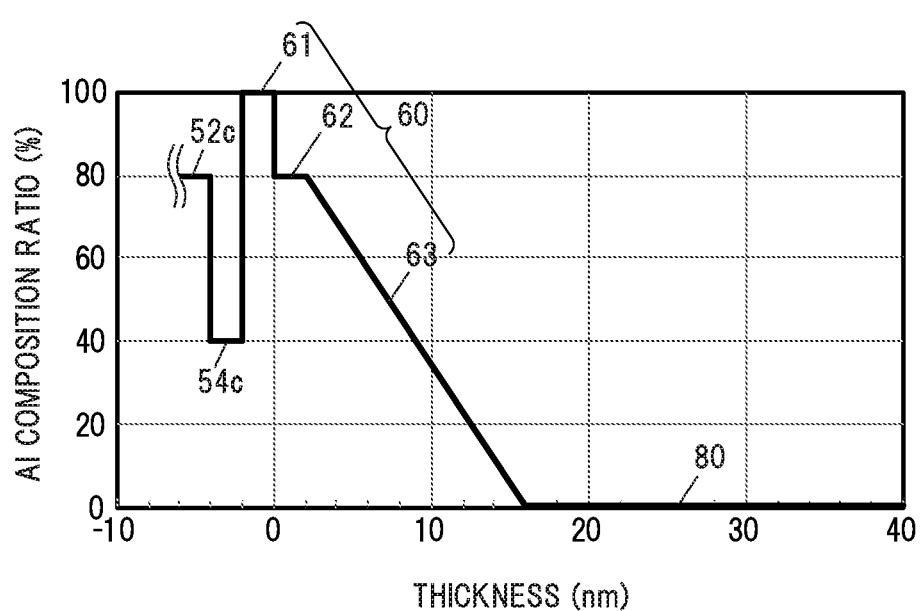
FIG. 3 is a diagram illustrating an Al composition ratio in the electron blocking stack body of the nitride semiconductor light-emitting element in one example of the first embodiment shown in FIG. 1.
Figure 4:
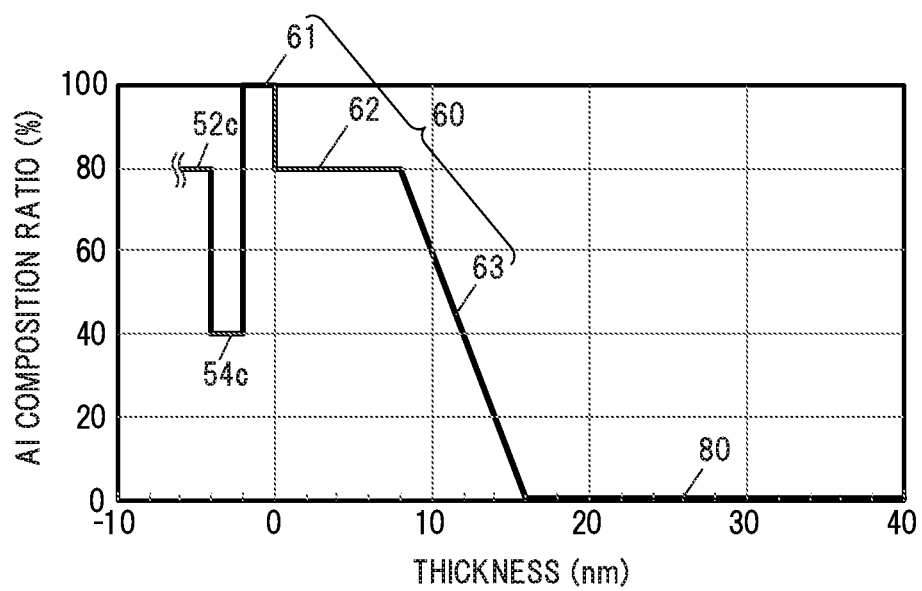
FIG. 4 is a diagram illustrating an Al composition ratio in the electron blocking stack body of the nitride semiconductor light-emitting element in another example of the first embodiment shown in FIG. 1.
Figure 5:
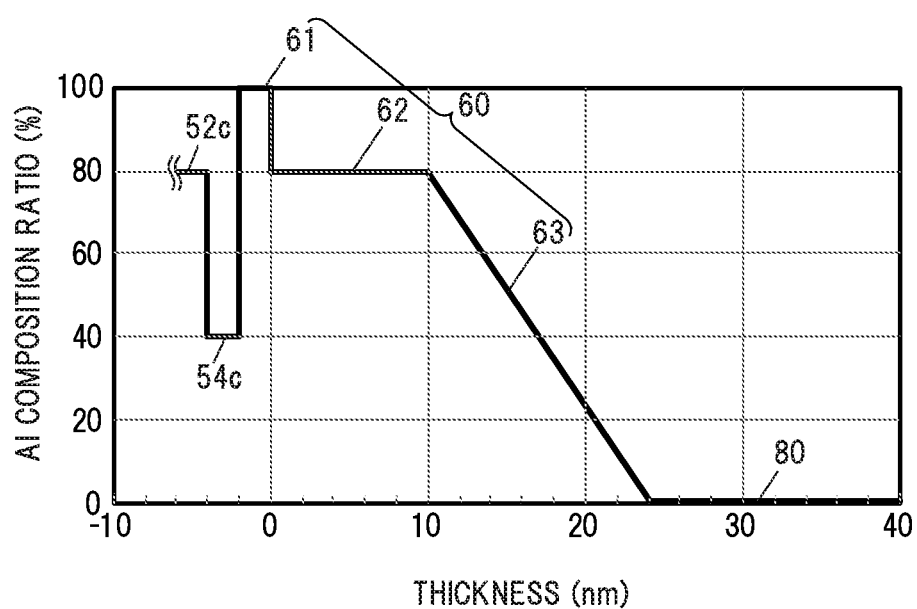
FIG. 5 is a diagram illustrating an Al composition ratio in the electron blocking stack body of the nitride semiconductor light-emitting element in another example of the first embodiment shown in FIG. 1.
Figure 6:
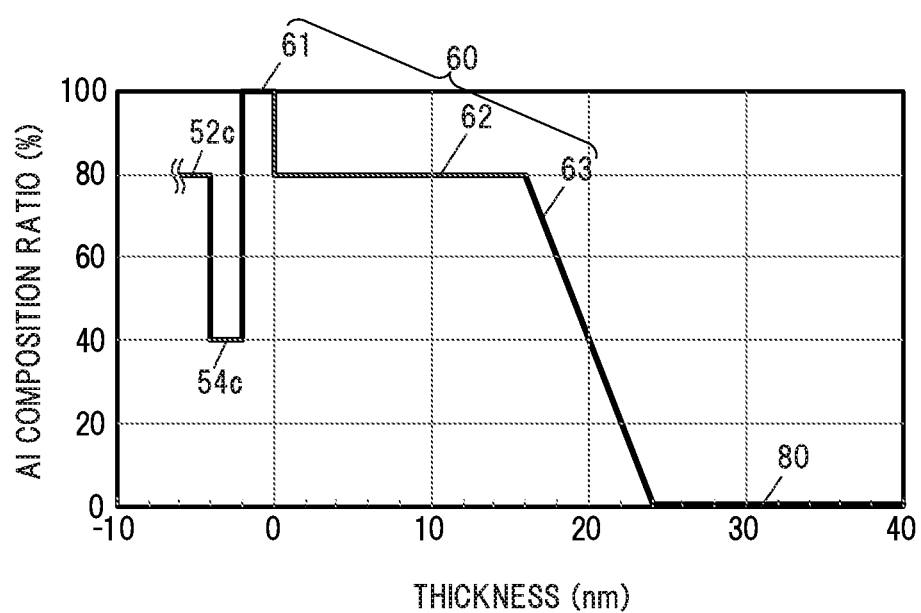
FIG. 6 is a diagram illustrating an Al composition ratio in the electron blocking stack body of the nitride semiconductor light-emitting element in another example of the first embodiment shown in FIG. 1.

Examples of the first embodiment will be described in reference to FIGS. 3 to 6. Four Examples 1 to 4 will be described below as the examples of the first embodiment. FIG. 3 is a diagram illustrating the Al composition ratio in the electron blocking stack body 60 of the light-emitting element 1 in Example 1. FIG. 4 is a diagram illustrating the Al composition ratio in the electron blocking stack body 60 of the light-emitting element 1 in Example 2. FIG. 5 is a diagram illustrating the Al composition ratio in the electron blocking stack body 60 of the light-emitting element 1 in Example 3. FIG. 6 is a diagram illustrating the Al composition ratio in the electron blocking stack body 60 of the light-emitting element 1 in Example 4. In FIGS. 3 to 6, the position of the boundary surface between the first electron blocking layer 61 and the second electron blocking layer 62 is shown as the start point of the thickness of the light-emitting element 1 (i.e., thickness=0).

As shown in FIGS. 3 to 6, the electron blocking stack body 60 of the light-emitting element 1 in each Example includes a sequentially stacked structure composed of the first electron blocking layer 61 having a high Al composition ratio, the third electron blocking layer 63 of which Al composition ratio has a gradient in the thickness direction, and the second electron blocking layer 62 provided between the first electron blocking layer 61 and the third electron blocking layer 63.

The first electron blocking layer 61, the second electron blocking layer 62 and the third electron blocking layer 63 satisfy the above-described relation of the expression (1) in terms of the Al composition ratio, and also satisfy the above-described relation in terms of the film thickness. In each Example, the Al composition ratio in the barrier layer 52 is about 80%, the Al composition ratio in the well layer 54 is about 40%, and the Al composition ratio in the p-type contact layer 80 is about 0%.

In addition, the gradient percentage (i.e., the decrease rate) $d_1$ of the Al composition ratio in the third electron blocking layer 63 satisfies the above-described expression (3). Information about the electron blocking stack body 60, such as the thickness and Al composition ratio of each layer and the decrease rate of the Al composition ratio in the third electron blocking layer 63, etc., shown in FIGS. 3 to 6 is summarized in Table 1 below.

TABLE 1

Information about Electron blocking stack body 60

| | First electron blocking layer 61 | | Second electron blocking layer 62 | | Third electron blocking layer 63 | | |
|---|---|---|---|---|---|---|---|
| | Thickness (nm) | Al composition ratio (%) | Thickness (nm) | Al composition ratio (%) | Thickness (nm) | Al composition ratio (%) | Decrease rate (%/nm (/nM)) |
| Example 1 | 2.0 | 100 | 2.0 | 80 | 14 | 80 | 5.7 (0.057) |
| Example 2 | 2.0 | 100 | 8.0 | 80 | 8.0 | 80 | 10 (0.10) |
| Example 3 | 2.0 | 100 | 10 | 80 | 14 | 80 | 5.7 (0.057) |
| Example 4 | 2.0 | 100 | 16 | 80 | 8.0 | 80 | 10 (0.10) |

Emission Lifetime

Figure 7:
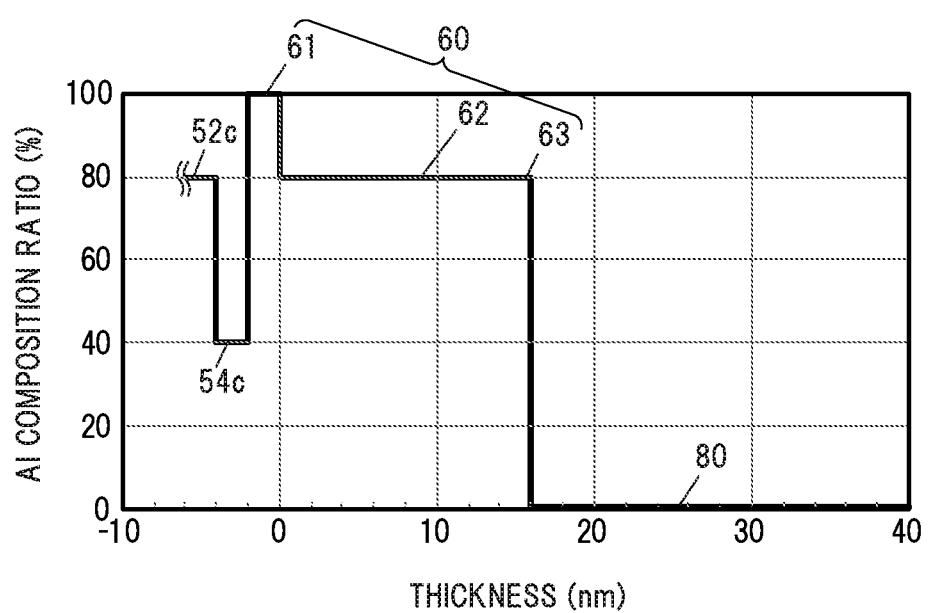
FIG. 7 is a diagram illustrating an Al composition ratio in the electron blocking stack body of the nitride semiconductor light-emitting element in Comparative Example.
Figure 8:
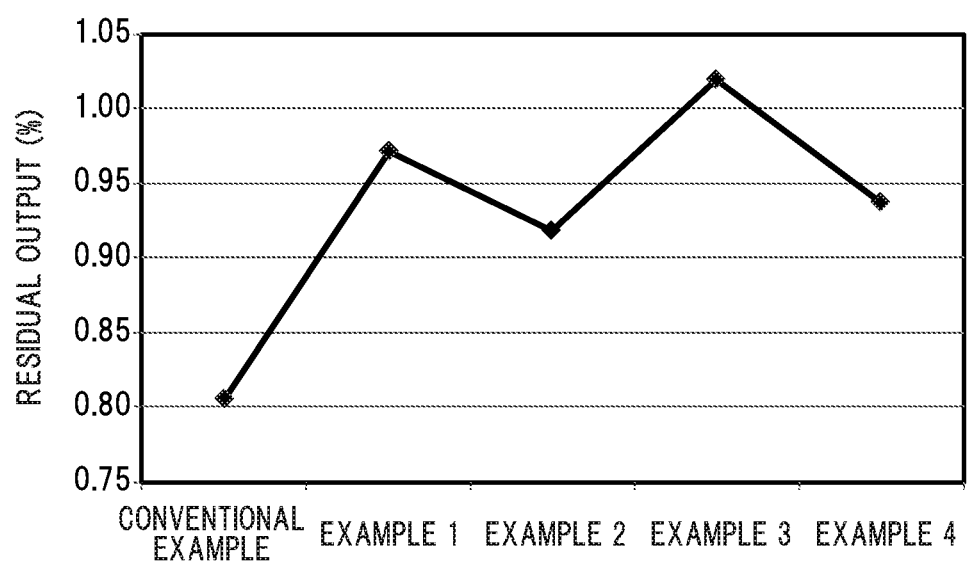
FIG. 8 is a comparative diagram illustrating the measurement results of residual output in Examples and Conventional Example.

Next, the measurement results of emission lifetime of the light-emitting elements 1 in Examples 1 to 4 will be described. FIG. 7 is a diagram illustrating the Al composition ratio in the electron blocking stack body 60 of a light-emitting element in Comparative Example. FIG. 8 is a diagram illustrating an example of the measurement results of emission lifetime of the light-emitting elements 1 in Examples 1 to 4. The emission lifetime was evaluated based on a ratio of emission output measured after supplying power for a predetermined time, with respect to the initial emission output (hereinafter, also referred to as "residual output").

The initial emission output was measured just after the light-emitting elements 1 were manufactured. The power supplying time was 1,000 hours. The emission output can be measured by various known methods. In this measurement, as an example, a certain current (e.g., 350 mA) was supplied between the n-side electrode 90 and the p-side electrode 92 which are described above, and emission output was measured by a photodetector placed under the light-emitting element 1.

Meanwhile, a light-emitting element provided with the electron blocking stack body 60 including the first electron blocking layer 61, the second electron blocking layer 62, and the third electron blocking layer 63 with an Al composition ratio which has a substantially constant value without gradient in the thickness direction as shown in FIG. 7 was used as Comparative Example. That is, the light-emitting element in Comparative Example is different from the light-emitting elements 1 in Examples 1 to 4 in that the Al composition ratio in the third electron blocking layer 63 has a substantially constant value without gradient in the thickness direction.

The measurement results are summarized in Table 2 below.

TABLE 2

Measurement results of Emission lifetime

| Light-emitting element | Measurement wavelength (nm) | Emission output 1 (mW) (*1) | Emission output 2 (mW) (*2) | Residual output (*3) |
|---|---|---|---|---|
| Comparative Example | 264.0 | 23.1 | 18.8 | 0.81 |
| Example 1 | 264.8 | 27.6 | 26.8 | 0.97 |
| Example 2 | 265.2 | 25.8 | 23.8 | 0.92 |
| Example 3 | 264.9 | 25.0 | 25.5 | 1.02 |
| Example 4 | 264.4 | 21.3 | 20.1 | 0.94 |

(*1) Initial emission output measured just after the light-emitting elements were manufactured.
(*2) Emission output measured after supplying power to the light-emitting elements for 1,000 hours.
(*3) Value (dimensionless unit) obtained by dividing the value recorded as Emission output 2 by the value recorded as Emission output 1.

FIG. 8 is a diagram in which the values of "residual output" in Table 2 are shown in the form of graph. As shown in FIG. 8, in contrast to Conventional Example in which the residual output fell to 0.81, the residual output only fell to 0.97 in Example 1, to 0.92 in Example 2, and to 0.94 in Example 4. In addition, in Example 3, it was observed that the residual output increased, albeit slightly. These measurement results demonstrate that the residual output values of the light-emitting elements 1 in Examples 1 to 4 were increased as compared to that of the light-emitting element in Conventional Example.

A large residual output value means that a drop from the initial emission output to emission output after 1,000 hours of power supply is small, i.e., emission lifetime is improved. Thus, the above-described measurement results show that the light-emitting elements 1 in Examples 1 to 4 have better emission lifetime than the light-emitting element in Conventional Example. It is considered that such improvement in emission lifetime is achieved since lattice mismatch in the p-type semiconductor layer including the electron blocking stack body 60 and the p-type contact layer 80 is reduced by configuring the third electron blocking layer 63 to have a gradient Al composition ratio in the thickness direction. It is because when lattice mismatch is reduced, occurrence of crystal defects such as dislocation is suppressed and crystal quality is improved.

Second Embodiment

Figure 9:
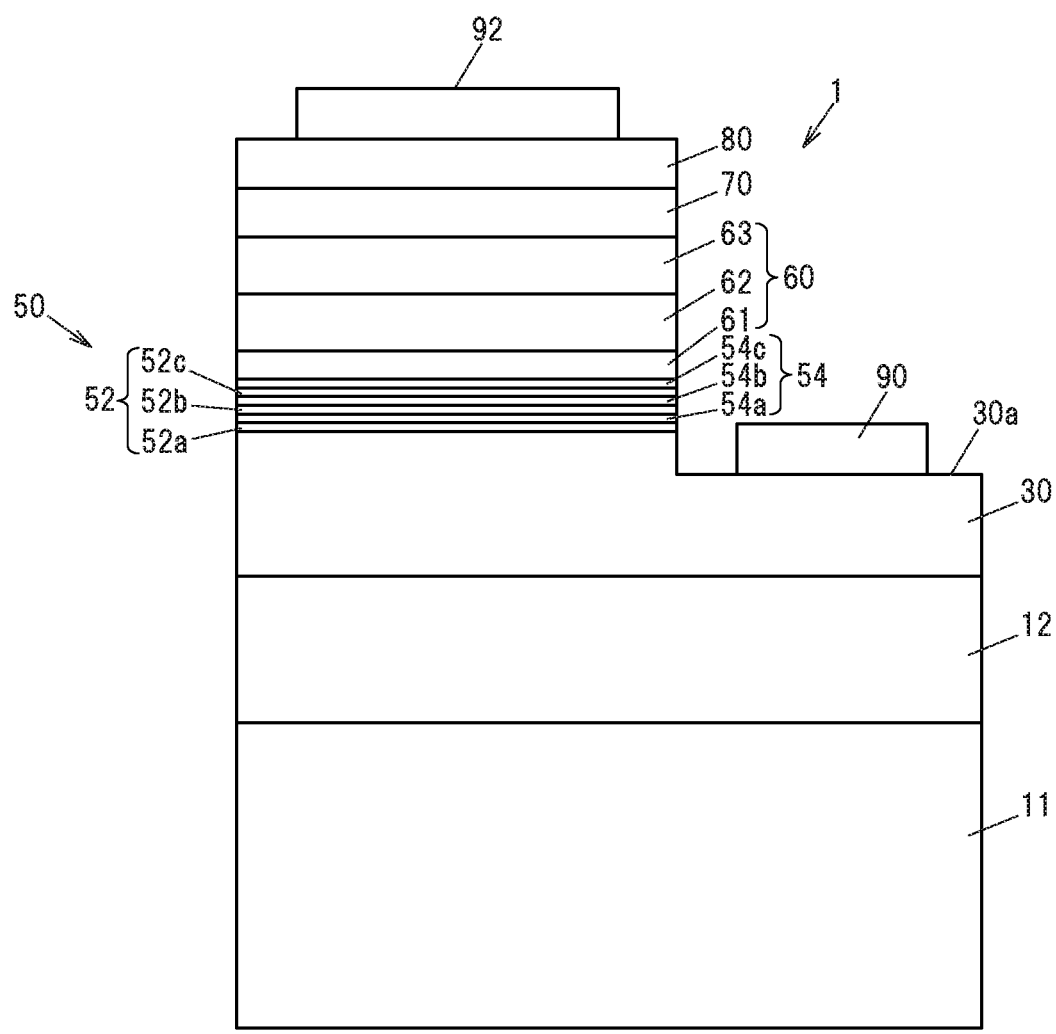
FIG. 9 is a schematic cross-sectional view showing an exemplary configuration of the nitride semiconductor light-emitting element in the second embodiment of the invention.

FIG. 9 is a schematic cross-sectional view showing an exemplary configuration of the light-emitting element 1 in the second embodiment of the invention. The light-emitting element 1 in the second embodiment is different from the light-emitting element 1 in the first embodiment in having a p-type cladding layer 70. Next, the difference from the first embodiment will be mainly described.

As shown in FIG. 9, the light-emitting element 1 in the second embodiment has the configuration of the light-emitting element 1 in the first embodiment described above and is further provided with the p-type cladding layer 70 located between the electron blocking stack body 60 and the p-type contact layer 80. The p-type cladding layer 70 has a thickness of about 10 nm to 1000 nm and is, e.g., about 20 nm to 800 nm in thickness. The p-type cladding layer 70 is a layer formed of p-type AlGaN.

The Al composition ratio in the p-type cladding layer 70 is not more than the Al composition ratio in the third electron blocking layer 63 and is also more than the Al composition ratio in the p-type contact layer 80. In short, the Al composition ratio in the electron blocking stack body 60 satisfies the following expression (4):

First electron blocking layer 61>Barrier layer
52>Second electron blocking layer 62>Third
electron blocking layer 63>p-type cladding
layer 70>p-type contact layer 80 (4).

The p-type cladding layer 70 may alternatively be a composition gradient layer of which Al composition ratio has a gradient in the thickness direction of the p-type cladding layer 70. In detail, the p-type cladding layer 70 may have an Al composition ratio which decreases from the electron blocking stack body 60 side toward the p-type contact layer 80 side.

When the p-type cladding layer 70 is a composition gradient layer, the gradient percentage (i.e., the decrease rate) of the Al composition ratio in the p-type cladding layer 70 may be substantially constant in the thickness direction thereof, or may change in the thickness direction. When the decrease rate is constant, the Al composition ratio in the p-type cladding layer 70 decreases linearly. In this case, a decrease rate $d_2$ of the Al composition ratio in the p-type cladding layer 70 is expressed by the following equation (5):

$$d_2 = h_2/w_2 \quad (5),$$

where $w_2$ (not shown) is the thickness of the p-type cladding layer 70 and $h_2$ (not shown) is a range of the Al composition ratio in the p-type cladding layer 70, i.e., a difference between the Al composition ratio on the electron blocking stack body 60 side and the Al composition ratio on the p-type contact layer 80 side.

The decrease rate $d_2$ of the Al composition ratio in the p-type cladding layer 70 is in the same range as the decrease rate $d_1$ of the Al composition ratio in the third electron blocking layer 63 and is, e.g., more than 2.5%/nm and not more than 20%/nm. In other words, the decrease rate $d_2$ of the Al composition ratio in the p-type cladding layer 70 satisfies the following expression (6):

$$0.025/nm < d_2 \leq 0.20/nm \quad (6).$$

In this case, the above expression (4) is satisfied when the maximum value of the Al composition ratio in the third electron blocking layer 63 (i.e., the Al composition ratio in the third electron blocking layer 63 on the second electron blocking layer 62 side) and the maximum value of the Al composition ratio in the p-type cladding layer 70 (i.e., the Al composition ratio in the p-type cladding layer 70 on the electron blocking stack body 60 side) are used. Thus, for example, the minimum value of the Al composition ratio in the third electron blocking layer 63 (i.e., the Al composition ratio in the third electron blocking layer 63 on the p-type cladding layer 70 side) may be smaller than the maximum value of the Al composition ratio in the p-type cladding layer 70 (i.e., the Al composition ratio in the p-type cladding layer 70 on the electron blocking stack body 60 side). In other words, the Al composition ratio may be discontinuous between the third electron blocking layer 63 and the p-type cladding layer 70.

By further providing the p-type cladding layer 70 which has a lower Al composition ratio than the Al composition ratio in the third electron blocking layer 63, it is possible to further improve the efficiency of hole injection into the well layer 54. In addition, it is considered that it is possible to further reduce the lattice mismatch in the p-type semiconductor layer by configuring the p-type cladding layer 70 as a composition gradient layer having a gradient Al composition ratio.

SUMMARY OF THE EMBODIMENTS

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A nitride semiconductor light-emitting element (1), comprising: an active layer (50) that emits ultraviolet light; a p-type AlGaN-based electron blocking stack body (60) that is located on the active layer (50) and comprises a structure formed by sequentially stacking a first electron blocking layer (61), a second electron blocking layer (62) and a third electron blocking layer (63) from the active layer (50) side; and a p-type contact layer (80) located on the electron blocking stack body (60), wherein an Al composition ratio in the second electron blocking layer (62) is lower than an Al composition ratio in the first electron blocking layer (61), and an Al composition ratio in the third electron blocking layer (63) decreases from the second electron blocking layer (62) side toward the p-type contact layer (80) side.

[2] The nitride semiconductor light-emitting element (1) described in [1], wherein a decrease rate of the Al composition ratio in the third electron blocking layer (63) is more than 0.025/nm and not more than 0.20/nm.

[3] The nitride semiconductor light-emitting element (1) described in [1] or [2], wherein the Al composition ratio in the third electron blocking layer (63) intermittently decreases from the second electron blocking layer (62) side toward the p-type contact layer (80) side.

[4] The nitride semiconductor light-emitting element (1) described in [1] or [2], wherein the Al composition ratio in the third electron blocking layer (63) continuously decreases from the second electron blocking layer (62) side toward the p-type contact layer (80) side.

[5] The nitride semiconductor light-emitting element (1) described in any one of [1] to [4], wherein the active layer (50) comprises a barrier layer (52) comprising AlGaN, and an Al composition ratio in the barrier layer (52) is not less than the Al composition ratio in the second electron blocking layer (62).

[6] The nitride semiconductor light-emitting element (1) described in any one of [1] to [5], further comprising: a p-type cladding layer (70) that is located between the electron blocking layer stack body (60) and the p-type contact layer (80) and comprises p-type AlGaN, wherein the Al composition ratio in the third electron blocking layer (63) is not less than the Al composition ratio in the p-type cladding layer (70).

[7] The nitride semiconductor light-emitting element (1) described in [6], wherein the Al composition ratio in the p-type cladding layer (70) decreases from the electron blocking stack body (60) side toward the p-type contact layer (80) side.

[8] The nitride semiconductor light-emitting element (1) described in [7], wherein a decrease rate of the Al composition ratio in the p-type cladding layer (70) is more than 0.025/nm and not more than 0.20/nm.

What is claimed is:

1. A nitride semiconductor light-emitting element, comprising:
   an active layer that emits ultraviolet light;
   a p-type AlGaN-based electron blocking stack body that is located on the active layer and comprises a structure formed by sequentially stacking a first electron blocking layer, a second electron blocking layer and a third electron blocking layer from the active layer side; and
   a p-type contact layer located on the electron blocking stack body,
   wherein an Al composition ratio in the second electron blocking layer is lower than an Al composition ratio in the first electron blocking layer, and an Al composition ratio in the third electron blocking layer decreases from the second electron blocking layer side toward the p-type contact layer side, and
   wherein a decrease rate of the Al composition ratio in the third electron blocking layer is more than 0.025/nm and not more than 0.20/nm.

2. The nitride semiconductor light-emitting element according to claim 1, wherein the Al composition ratio in the third electron blocking layer intermittently decreases from the second electron blocking layer side toward the p-type contact layer side.

3. The nitride semiconductor light-emitting element according claim 1, wherein the Al composition ratio in the third electron blocking layer continuously decreases from the second electron blocking layer side toward the p-type contact layer side.

4. A nitride semiconductor light-emitting element, comprising:
   an active layer that emits ultraviolet light;
   a p-type AlGaN-based electron blocking stack body that is located on the active layer and comprises a structure formed by sequentially stacking a first electron blocking layer, a second electron blocking layer and a third electron blocking layer from the active layer side; and
   a p-type contact layer located on the electron blocking stack body,
   wherein an Al composition ratio in the second electron blocking layer is lower than an Al composition ratio in the first electron blocking layer, and an Al composition ratio in the third electron blocking layer decreases from the second electron blocking layer side toward the p-type contact layer side, and
   wherein the active layer comprises a barrier layer comprising AlGaN, and an Al composition ratio in the barrier layer is not less than the Al composition ratio in the second electron blocking layer.

5. A nitride semiconductor light-emitting element, comprising:
   an active layer that emits ultraviolet light;
   a p-type AlGaN-based electron blocking stack body that is located on the active layer and comprises a structure formed by sequentially stacking a first electron blocking layer, a second electron blocking layer and a third electron blocking layer from the active layer side;
   a p-type contact layer located on the electron blocking stack body, and
   a p-type cladding layer that is located between the electron blocking stack body and the p-type contact layer and comprises p-type AlGaN,
   wherein an Al composition ratio in the second electron blocking layer is lower than an Al composition ratio in the first electron blocking layer, and an Al composition ratio in the third electron blocking layer decreases from the second electron blocking layer side toward the p-type contact layer side, and wherein the Al composition ratio in the third electron blocking layer is not less than the Al composition ratio in the p-type cladding layer.

6. The nitride semiconductor light-emitting element according to claim 5, wherein the Al composition ratio in the p-type cladding layer decreases from the electron blocking stack body side toward the p-type contact layer side.

7. The nitride semiconductor light-emitting element according to claim 6, wherein a decrease rate of the Al composition ratio in the p-type cladding layer is more than 0.025/nm and not more than 0.20/nm.

* * * * *